United States Patent
Tang et al.

(10) Patent No.: US 12,028,030 B2
(45) Date of Patent: Jul. 2, 2024

(54) DYNAMIC COMMON-MODE ADJUSTMENT FOR POWER AMPLIFIERS

(71) Applicant: QUALCOMM Incorporated, San Diego, CA (US)

(72) Inventors: Dongyang Tang, San Diego, CA (US); Xinwang Zhang, San Diego, CA (US); ChienChung Yang, San Diego, CA (US); Earl Schreyer, Raleigh, NC (US); Sherif Galal, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/648,958

(22) Filed: Jan. 26, 2022

(65) Prior Publication Data

US 2023/0238925 A1    Jul. 27, 2023

(51) Int. Cl.
*H03F 3/217*    (2006.01)
*H03F 3/45*    (2006.01)

(52) U.S. Cl.
CPC ......... *H03F 3/217* (2013.01); *H03F 2200/03* (2013.01)

(58) Field of Classification Search
CPC ......... H03F 3/217; H03F 2200/03; H03F 3/45
USPC .............. 330/251, 10, 207 A, 252–261
See application file for complete search history.

(56) References Cited

U.S. PATENT DOCUMENTS

| | | | |
|---|---|---|---|
| 8,823,453 B2* | 9/2014 | Nys ............. | H03F 3/45183 330/69 |
| 10,027,294 B2* | 7/2018 | Wang ........... | H03F 3/185 |
| 2021/0067106 A1 | 3/2021 | Lin et al. | |
| 2021/0305952 A1* | 9/2021 | Terwal .......... | H04R 3/00 |

OTHER PUBLICATIONS

International Search Report and Written Opinion—PCT/US2023/060499—ISA/EPO—May 9, 2023.
Wang C-W., et al., "A 118 DB PSRR, 0.00067% (−103.5 dB) THD+N and 3.1 W Fully Differential Class-D Audio Amplifier With PWM Common Mode Control", IEEE Journal of Solid-state Circuits, vol. 51, No. 12, Dec. 1, 2016, pp. 2808-2818, XP093012455, USA ISSN: 0018-9200, figures 1-11, pp. 2808, left-hand column, line 1—p. 2815, right-hand column, line 23.

* cited by examiner

*Primary Examiner* — Hieu P Nguyen
(74) *Attorney, Agent, or Firm* — Patterson + Sheridan, L.L.P.

(57) ABSTRACT

Aspects of the present disclosure relate to apparatus and methods for dynamically adjusting the common-mode input signal of a power amplifier, such as a class-D power amplifier. One example power amplifier circuit generally includes a first amplifier having a signal input and a power input; and a common-mode adjustment circuit having a first input coupled to the power input of the first amplifier, having an output coupled to the signal input of the first amplifier, and being configured to generate a common-mode signal to apply to the signal input of the first amplifier, based on a power supply voltage on the power input of the first amplifier.

22 Claims, 5 Drawing Sheets

DYNAMIC COMMON-MODE ADJUSTMENT FOR POWER AMPLIFIERS

TECHNICAL FIELD

Certain aspects of the present disclosure generally relate to electronic circuits and, more particularly, to techniques and apparatus for dynamically adjusting the common-mode input signal of a power amplifier, such as a class-D power amplifier.

BACKGROUND

A speaker is a transducer that produces a pressure wave in response to an input electrical signal, and thus, sound is generated. The speaker input signal may be produced by an audio amplifier that receives a relatively lower voltage analog audio signal and generates an amplified signal (with a relatively higher voltage) to drive the speaker. A dynamic loudspeaker is typically composed of a lightweight diaphragm (a cone) connected to a rigid basket (a frame) via a flexible suspension (often referred to as a spider) that constrains a voice coil to move axially through a cylindrical magnetic gap. When the input electrical signal is applied to the voice coil, a magnetic field is created by the electric current in the coil, thereby forming a linear electric motor. By varying the electrical signal from the audio amplifier, the mechanical force generated by the interaction between the magnet and the voice coil is modulated and causes the cone to move back and forth, thereby creating the pressure waves interpreted as sound.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure generally relate to dynamically adjusting the common-mode input signal of a power amplifier (e.g., a class-D power amplifier).

Certain aspects of the present disclosure are directed to a power amplifier circuit. The power amplifier circuit generally includes a first amplifier and a common-mode adjustment circuit. The first amplifier has a signal input and a power input. The common-mode adjustment circuit has a first input coupled to the power input of the first amplifier and has an output coupled to the signal input of the first amplifier. The common-mode adjustment circuit is generally configured to generate a common-mode signal to apply to the signal input of the first amplifier, based on a power supply voltage on the power input of the first amplifier.

Certain aspects of the present disclosure are directed to a method of amplification. The method generally includes amplifying an input signal with a power amplifier circuit comprising a first amplifier powered by a first power supply voltage, sensing the first power supply voltage, generating a common-mode signal based on the first power supply voltage, and applying the common-mode signal to the first amplifier.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to techniques and apparatus for dynamically adjusting the common-mode input signal of a power amplifier (e.g., a class-D power amplifier). Such a power amplifier may be used to amplify audio signals, for example.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Audio System with a Power Amplifier

Figure 1:
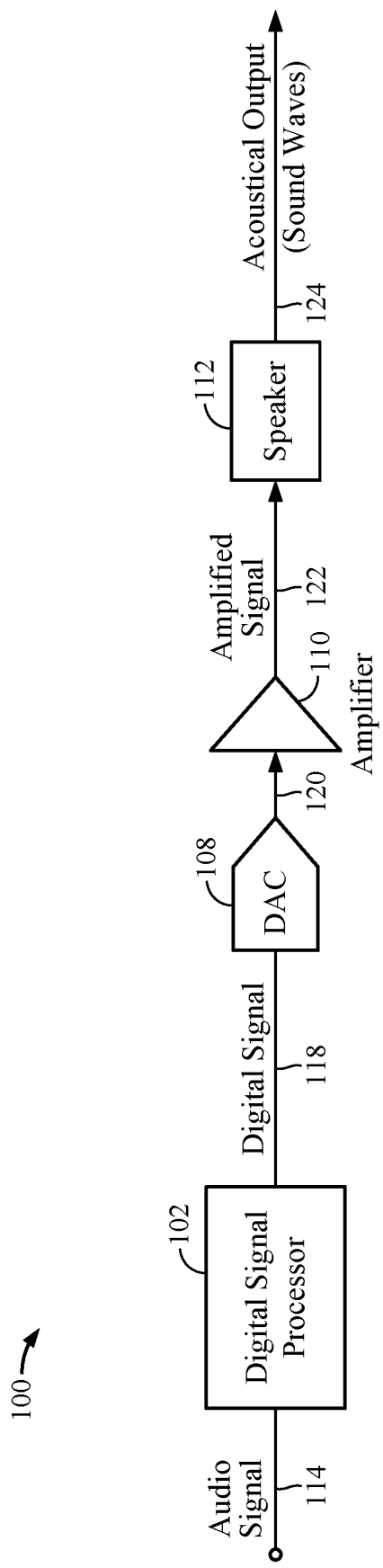
FIG. 1 illustrates an example audio amplifier system, in which aspects of the present disclosure may be practiced.

FIG. 1 illustrates an example audio system 100, in which aspects of the present disclosure may be practiced. As illustrated, a digital signal processor (DSP) 102 may receive and process audio signals 114 (e.g., a digital audio signal) by, for example, applying a digital filter aimed at increasing audio quality. The filtered or otherwise processed digital signal 118 produced by the DSP 102 (or a further processed version thereof) may be converted to an analog signal 120 using a digital-to-analog converter (DAC) 108. In certain aspects, the DAC may be implemented as part of the DSP 102 or an amplifier 110. In certain aspects, the analog signal 120 may be amplified using the amplifier 110 to generate an amplified signal 122. The amplified signal 122 may drive a speaker 112 to produce an acoustic output 124 (e.g., sound waves).

High output volume in mobile devices is becoming increasingly important in next-generation mobile devices. Higher volume directly translates to higher audio amplifier output power. Higher output power may be difficult to achieve with the relatively low voltages provided by lithium-ion batteries. Therefore, on-chip boost switchers may be used to boost the battery voltage to a higher level that supplies the audio power amplifier (e.g., amplifier 110). For certain aspects, the amplifier 110 may be implemented as a class-D amplifier due to the relatively high power efficiency associated with class-D amplifiers. The efficiency of the class-D amplifier may be further improved by implementing the class-D amplifier in an H-bridge configuration, for example.

Example Dynamic Common-Mode Adjustment for a Power Amplifier

Figure 2:
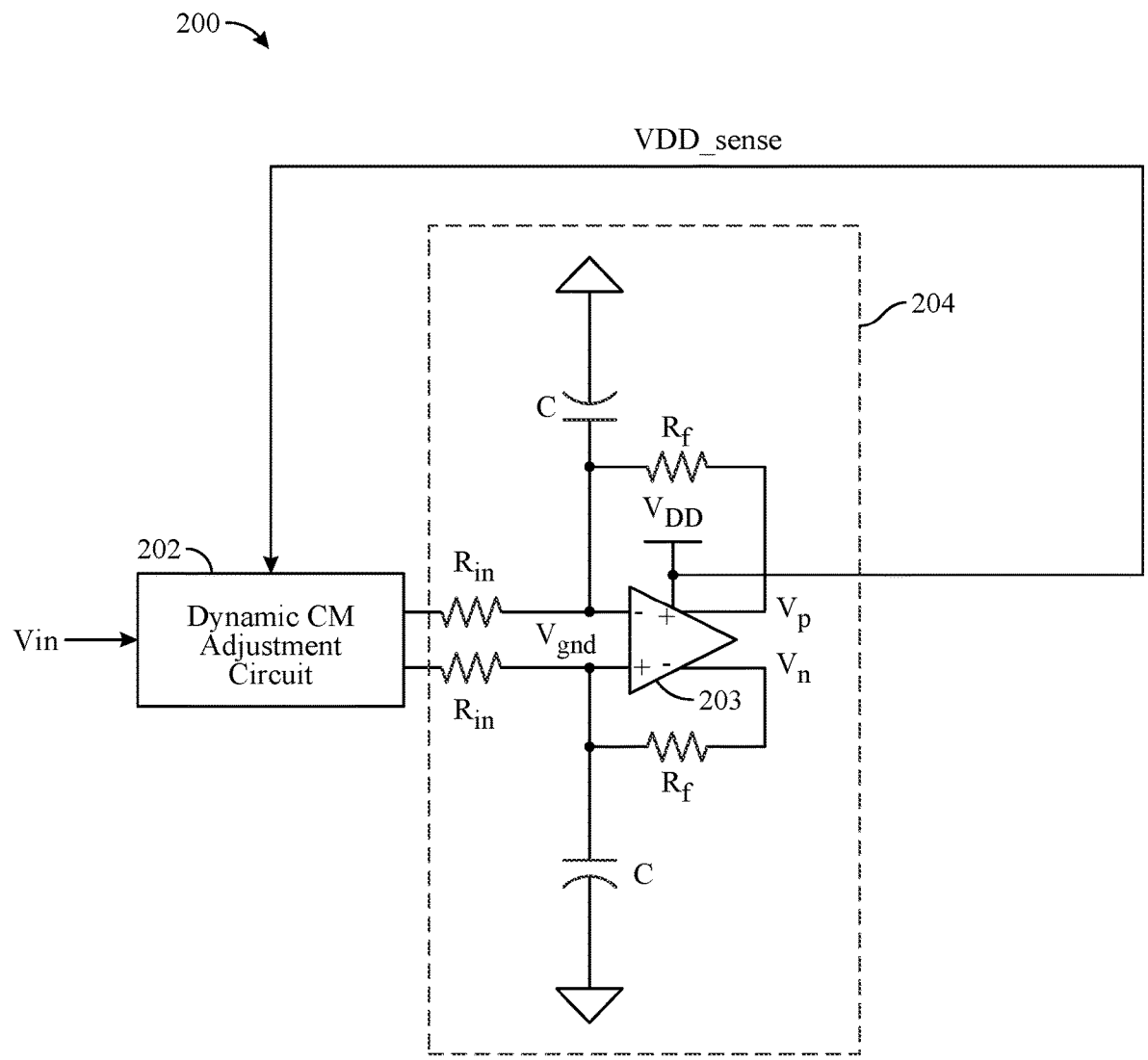
FIG. 2 is a block diagram of an example power amplifier and a dynamic common-mode (CM) adjustment circuit, in accordance with certain aspects of the present disclosure.

FIG. 2 is a block diagram of an example representative power amplifier circuit 200, in accordance with certain aspects of the present disclosure. The power amplifier circuit 200 may be included in any of various suitable systems having a power amplifier, such as in the amplifier 110 of the audio system 100, as described above with respect to FIG. 1.

As illustrated in FIG. 2, the power amplifier circuit 200 includes class-D power amplifier circuitry 204, which is represented here by a simplified circuit diagram. Although described as class-D power amplifier circuitry, the power amplifier circuitry 204 may represent or be replaced by any of other various suitable power amplifier circuits. For ease of understanding and consistency, however, the remainder of this disclosure will refer to this power amplifier circuitry 204 as class-D power amplifier circuitry. As shown in this simplified circuit diagram of FIG. 2, the power amplifier circuitry 204 includes an amplifier 203, input resistors $R_{in}$, feedback resistors $R_f$, and shunt capacitors C. The input resistors $R_{in}$ are coupled between the differential inputs to the power amplifier circuitry 204 and the inputs to the amplifier 203, which are considered as the virtual ground for the power amplifier circuit 200 and are labeled "$V_{gnd}$." The shunt capacitors C are coupled between the inputs of the amplifier 203 and a reference potential node (e.g., electrical ground) for the power amplifier circuit 200. The feedback resistors $R_f$ are coupled between the differential outputs and differential inputs of the amplifier 203. A power supply input of the amplifier 203 may be coupled to a power supply rail (labeled "$V_{DD}$"), which may be a battery voltage or a regulated voltage based on a battery voltage, for example.

The output of a class-D power amplifier is a square wave, which swings rail-to-rail and switches between $V_{DD}$ and ground. In idle mode (when there is no input to the power amplifier), the common-mode output of the circuit is $V_{DD}/2$. In portable devices with stacked battery systems having more than one battery cell, the battery voltage (e.g., $V_{DD}$) for internal components (e.g., a class-D power amplifier) can have a large variation and can become quite large. For example, the battery voltage may range from about 3 V to about 10 V for 2-cell-in-series (2S) stacked batteries, and to about 15 V for 3-cell-in-series (3S) stacked batteries. This large battery voltage may cause problems with the power amplifier circuitry 204. For example, the virtual ground voltage may be based on the feedback factor, the resistance-capacitance time constant (of the feedback resistors $R_f$ and the capacitors C), and the duty cycle of the pulse-width modulator (PWM) for the power amplifier circuit, where the worst case is a duty cycle of 50%. If the power amplifier circuitry is designed with a medium-voltage device (e.g., if the amplifier 203 has a maximum voltage tolerance of 6 V) and the virtual ground swing reaches a substantial voltage (e.g., >6 V), the amplifier may run out of headroom. As a result, the amplifier does not work as designed, and the high battery voltage may damage the amplifier.

The problems associated with the large battery voltage may be addressed by increasing the resistance value of the feedback resistors $R_f$. However, increasing the feedback resistance degrades the noise, offset, click and pop (CnP) noise, and power supply rejection ratio (PSRR) characteristics of the circuit, which is undesirable.

Accordingly, certain aspects of the present disclosure provide techniques and apparatus for dynamically adjusting the common-mode input signal of a class-D power amplifier, especially for stacked battery cells or other relatively high-voltage power supply rails for the power amplifier. For example, the power amplifier circuit 200 in FIG. 2 also includes a dynamic common-mode (CM) adjustment circuit 202.

The dynamic CM adjustment circuit 202 may be configured to monitor the power supply rail (e.g., $V_{DD}$, which may represent the battery voltage) for the power amplifier circuitry 204 in order to appropriately adjust a common-mode input voltage (VCMI) for the power amplifier circuitry 204. Said another way, the dynamic CM adjustment circuit 202 may be configured to generate a CM signal (with an appropriate DC offset) to apply to the input of the power amplifier circuitry 204, based on a sensed power supply voltage (labeled "VDD_sense") on the power input of the power amplifier circuitry 204, to ensure that the power amplifier circuitry (e.g., the amplifier 203) stays within its working range and avoids the aforementioned headroom issue. For certain aspects, the dynamic CM adjustment circuit 202 may continuously monitor the power supply voltage on the supply rail, while in other aspects, the dynamic CM adjustment circuit 202 may periodically or intermittently monitor the power supply voltage.

For certain aspects, the dynamic CM adjustment circuit 202 may have a second input coupled to an input node (labeled "Vin") of the power amplifier circuit. In this case, the dynamic CM adjustment circuit 202 may be configured to apply, to the differential signal inputs of the amplifier 203, a sum of the common-mode signal and an input signal on the input node. For other aspects, the dynamic CM adjustment circuit 202 may provide the common-mode signal to the amplifier 203, and the amplifier 203 may handle the common-mode signal internally.

Figure 3:
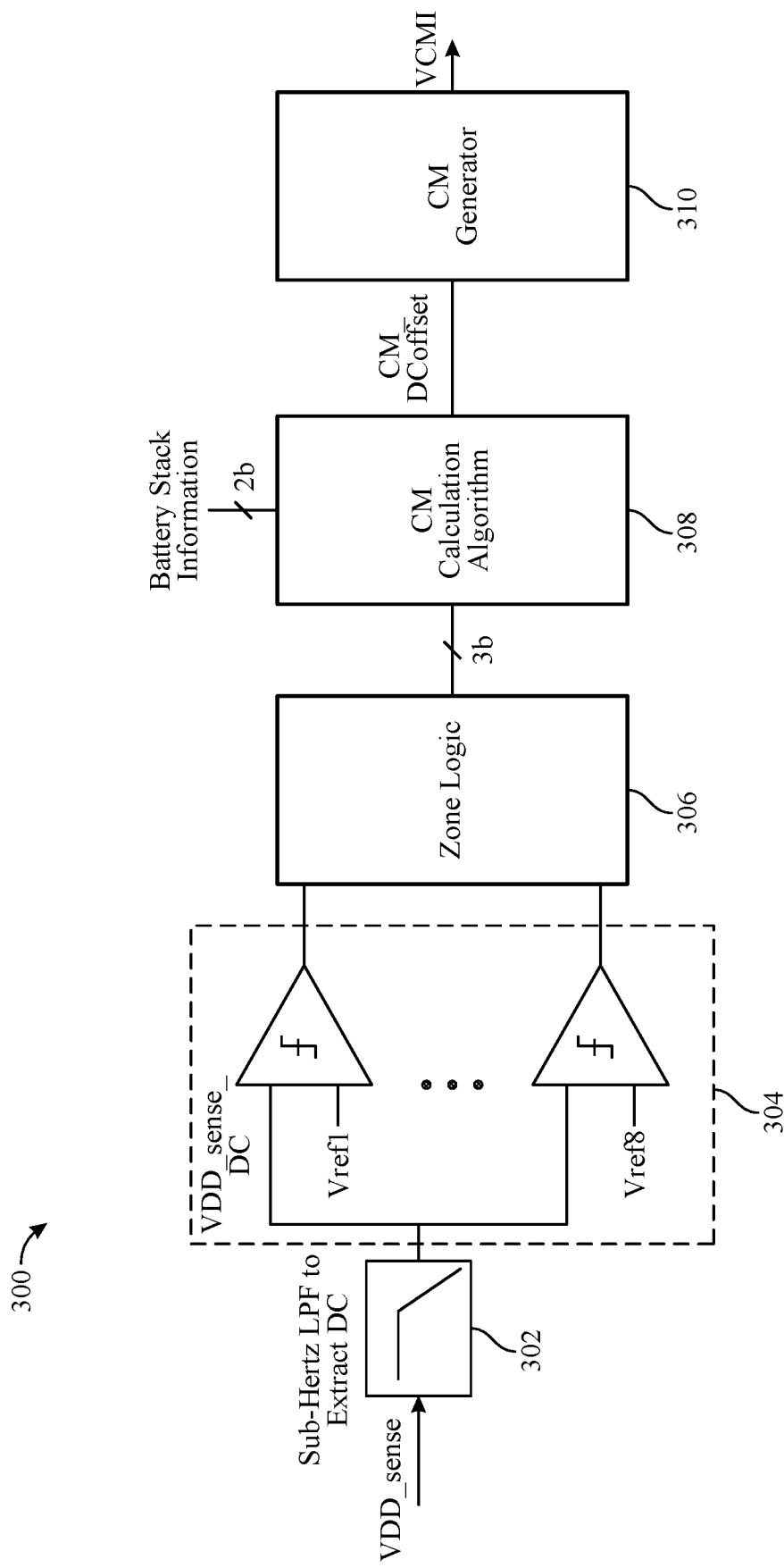
FIG. 3 is a block diagram illustrating example components of the dynamic CM adjustment circuit of FIG. 2, in accordance with certain aspects of the present disclosure.

FIG. 3 is a block diagram illustrating example components of the dynamic CM adjustment circuit 202 of FIG. 2, in accordance with certain aspects of the present disclosure. According to certain aspects, the CM adjustment circuit 300 may be configured to determine a CM offset based on the power supply voltage on the power input of power amplifier circuitry (e.g., the power amplifier circuitry 204), and generate a CM signal (e.g., VCMI) based on the determined CM offset. As illustrated, the CM adjustment circuit 300 may include a low-pass filter 302, comparator circuitry 304, zone logic 306, CM calculation algorithm logic 308, and a CM generator 310.

The low-pass filter 302 may be a sub-hertz low-pass filter (e.g., have a sub-hertz cutoff frequency) to extract a DC signal (labeled "VDD_sense_DC") from the input signal (e.g., VDD_sense).

The comparator circuitry 304 may include a plurality of comparators, each comparator having one input receiving the output of the low-pass filter 302 and another input receiving various reference voltages (labeled "Vref1" through "Vref8" for eight different reference voltages associated with eight different comparator outputs representing nine different zones). In this manner, the comparator circuitry 304 may be used to determine the level of the filtered DC signal and output a digital representation thereof (i.e., digitize VDD_sense_DC). Although eight different reference voltages (and eight different comparators) are implied in the comparator circuitry 304, it is to be understood that the comparator circuitry may include more or less than eight comparators with a corresponding number of different reference voltages. The outputs of the comparators may be coupled to inputs of the zone logic 306, which may convert the parallel digital outputs of the comparator circuitry 304 into a digital word (e.g., a 3-bit value to represent eight different zones). For this conversion, the zone logic 306 may include a digital encoder, and thus, the comparator circuitry 304 and the zone logic 306 may have a similar structure and function as a flash analog-to-digital converter (ADC).

The CM calculation algorithm logic 308 may have a first input for receiving an output of the zone logic 306. For certain aspects, the CM calculation algorithm logic 308 may also have a second input for receiving battery stack information, as shown in FIG. 3. The battery stack information may be a 2-bit value, for example, that may include or represent information such as the number of cells in the stacked battery or the average battery voltage. The CM calculation algorithm logic 308 may determine a CM offset (labeled "CM_DCoffset") based on the zone information for the sensed power supply voltage (and on the battery stack information).

An output of the CM calculation algorithm logic 308 may be coupled to an input of the CM generator 310. The CM generator 310 may generate the CM input signal (VCMI) for the power amplifier circuit (e.g., the power amplifier circuitry 204 in FIG. 2) based on the CM offset. The algorithm logic 308 may determine that the power supply voltage for the power amplifier is higher than desired and may indicate for the CM generator 310 to generate a CM signal (VCMI) with a lower voltage.

Figure 4:
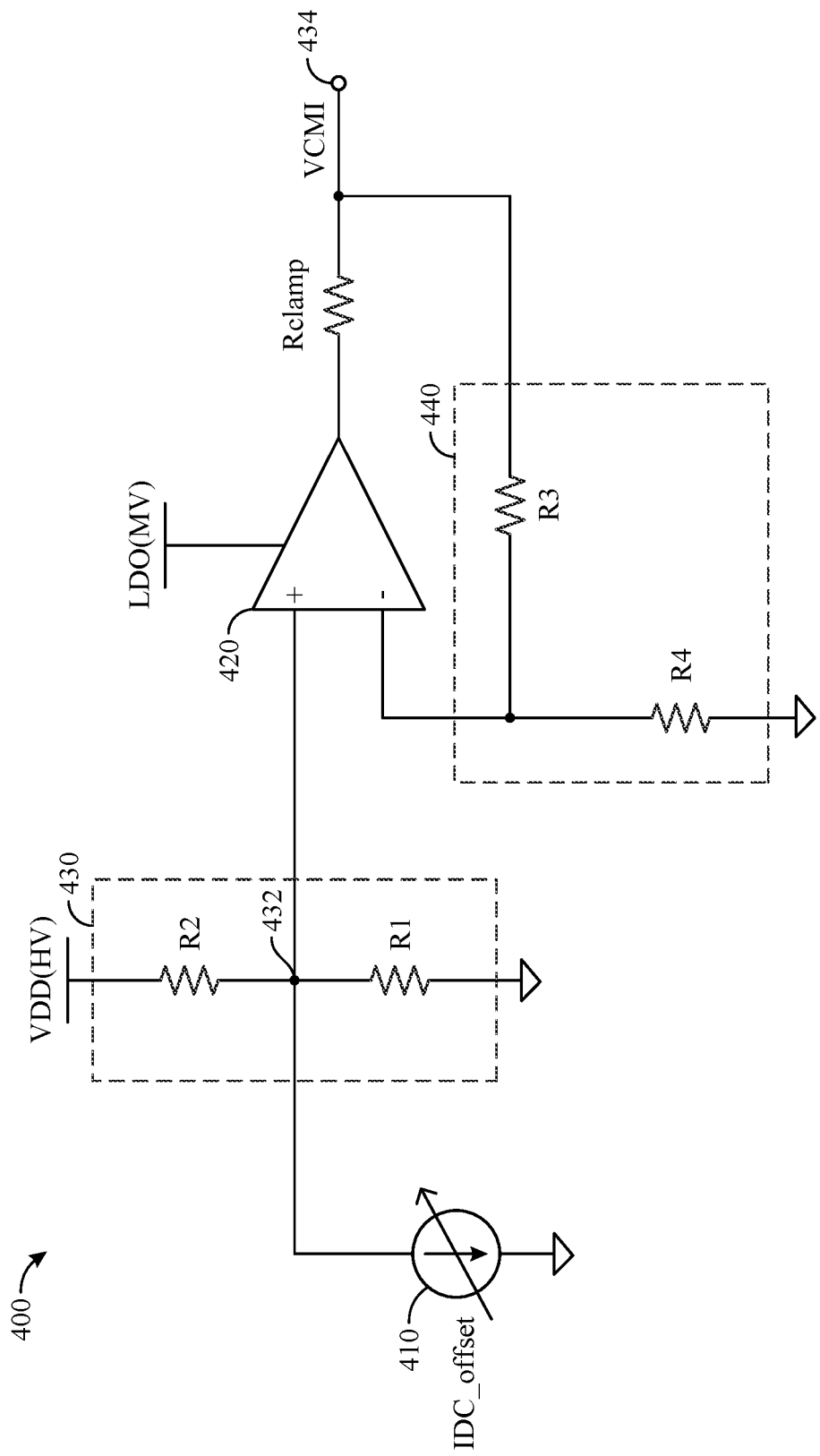
FIG. 4 is a block diagram of an example CM generator for use in the dynamic CM adjustment circuit of FIG. 3, in accordance with certain aspects of the present disclosure.

FIG. 4 is a block diagram of an example CM generator 400 for use in the CM adjustment circuit 300 of FIG. 3, in accordance with certain aspects of the present disclosure. For example, the CM generator 400 may implement the CM generator 310 in FIG. 3. The CM generator 400 includes an adjustable current source 410, an amplifier 420, a voltage divider 430, and a feedback circuit 440.

The adjustable current source 410 may be coupled between a positive input of the amplifier 420 and a reference potential node (e.g., electrical ground) for the CM generator 400. The adjustable current source 410 may have a control input coupled to the output of the algorithm circuitry (e.g., algorithm logic 308) for adjusting the current (labeled "IDC_offset"). The voltage divider 430 may include a first resistive element R1 and a second resistive element R2 with a tap 432 coupled to the positive input of the amplifier 420 and to the adjustable current source 410. The resistive element R1 may be coupled between the tap 432 and the reference potential node. The resistive element R2 may be coupled between the tap 432 and a power supply rail (labeled "VDD(HV)"), as shown. For certain aspects, the power supply rail VDD(HV) may be the same as the power supply rail for the amplifier 203 in FIG. 2. The resistance values of the first resistive element R1 and the second resistive element R2 may be related; for example, the resistance of the second resistive element R2 may be three times the resistance of the first resistive element R1.

The CM generator 400 may also include a clamping resistive element Rclamp coupled between an output of the amplifier 420 and an output node 434 of the CM generator. The feedback circuit 440 may be coupled between the output node 434 and the negative input of the amplifier 420. The feedback circuit 440 may include a resistive element R3 coupled between the negative input of the amplifier 420 and the output node 434 of the CM generator 400, and a resistive element R4 coupled between the negative input of the amplifier 420 and the reference potential node. The resistance values of resistive elements R3 and R4 may be related; for example, resistive elements R3 and R4 may have the same resistance. The amplifier 420 may have a power supply input coupled to power supply rail with a regulated voltage LDO(MV), as shown (e.g., from a low-dropout (LDO) regulator). The voltage LDO(MV) may be a medium voltage (MV), which may be a lower voltage than the high voltage (HV) of the power supply rail VDD(HV).

As previously stated, the algorithm circuitry (e.g., the algorithm logic 308) may determine that a power supply voltage for the power amplifier is higher than desired and may indicate for the CM generator 400 to generate a CM signal with a lower voltage.

According to certain aspects of the present disclosure, the algorithm circuitry may determine that the power amplifier has enough voltage headroom such that the CM generator 400 need not limit the CM input voltage for the power amplifier. In such a case, the CM generator 400 may generate an output voltage ($V_{CMI}$) equal to $$\left(\frac{VDD}{4} - IDC_{offset} * R_{eq}\right) * 2$$

which is equal to $$\frac{VDD}{2} - CM_{dcoffset}$$

and where Req=3R1/4 if the resistance of resistive element R2 is three times the resistance of resistive element R1. In other words, the adjustable current source 410 is configured to sink a variable amount of current ($IDC_{offset}$) based on the common-mode offset ($CM_{dcoffset}$ from the algorithm logic 308) to make this equation true.

According to certain aspects of the present disclosure, the algorithm circuitry may determine that the power amplifier has run out of headroom such that the CM generator 400 should limit the CM input voltage for the power amplifier. In such a case, the CM generator 400 may generate a maximum CM input voltage ($V_{CMI, max}$) equal to $$LDO(MV) * \frac{R3 + R4}{R3 + R4 + Rclamp}$$

For example, in a scenario where LDO(MV)=6 V, $V_{CMI, max}$ may be set at about 5 V.

Said another way, the CM generator 400 may be configured to generate the CM signal as a minimum between: (1) a predefined maximum value (e.g., $W_{CMI, max}$) and (2) a difference between: (a) half of a voltage of the first power supply rail (VDD/2) and (b) the common-mode offset ($CM_{dcoffset}$).

Example Operations for Amplification

Figure 5:
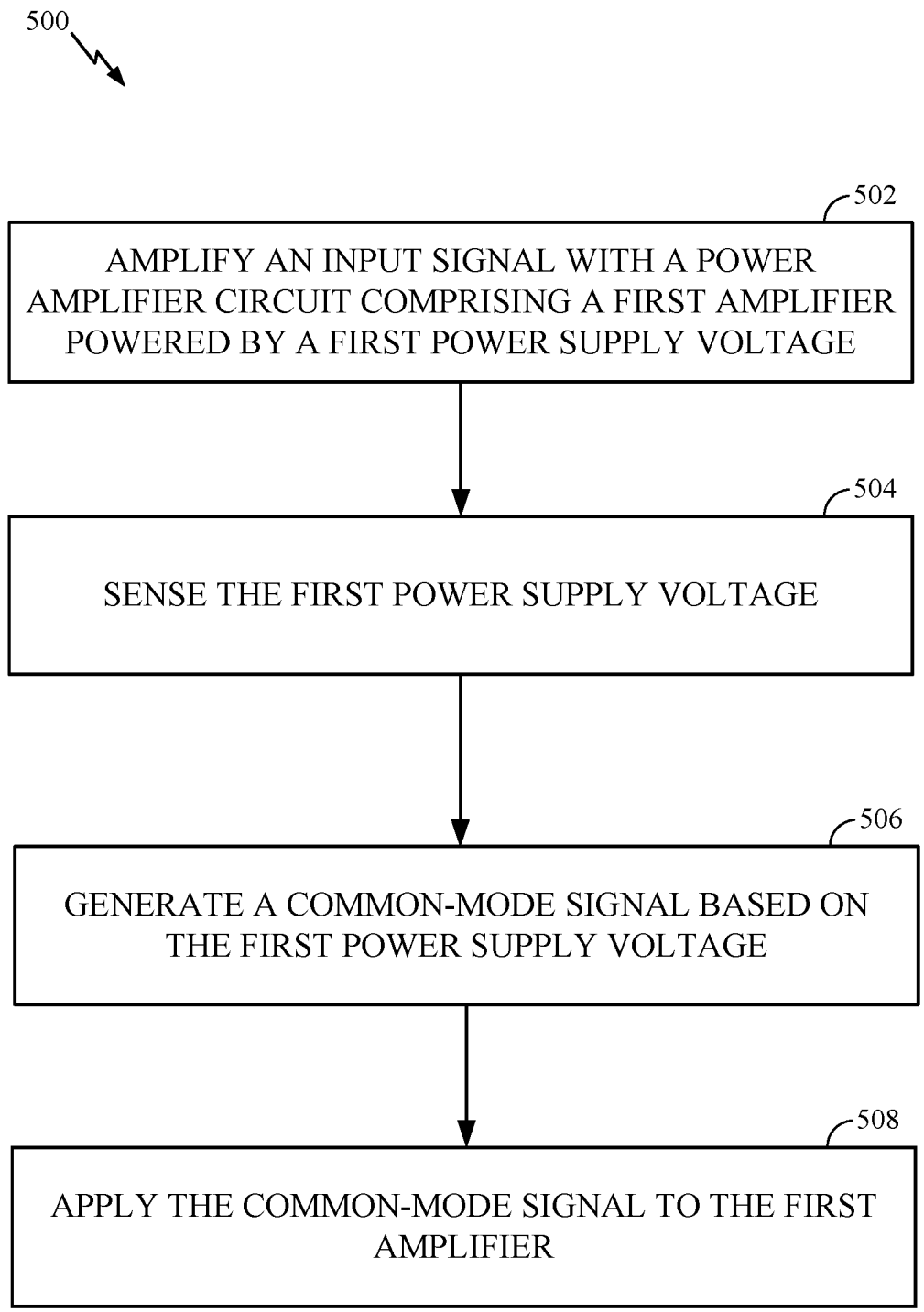
FIG. 5 is a flow diagram of example operations for amplifying an input signal, in accordance with certain aspects of the present disclosure.

FIG. 5 is a flow diagram of example operations 500 for amplifying an input signal, in accordance with certain aspects of the present disclosure. The operations 500 may be performed by a power amplifier circuit, such as the power amplifier circuit 200 of FIG. 2.

The operations 500 may begin, at block 502, with an amplifier (e.g., power amplifier circuitry 204, and more particularly, amplifier 203) of the power amplifier circuit amplifying an input signal. The power amplifier circuit may include a first amplifier (e.g., amplifier 203) powered by a first power supply voltage (e.g., $V_{DD}$). At block 504, the power amplifier circuit (and more particularly, a dynamic CM adjustment circuit, such as the dynamic CM adjustment circuit 202) may sense the first power supply voltage. At block 506, the dynamic CM adjustment circuit may generate a common-mode signal (e.g., VCMI) based on the first power supply voltage. At block 508, the dynamic CM adjustment circuit may apply the common-mode signal to the first amplifier.

According to certain aspects, generating the common-mode signal at block 506 may include determining a common-mode offset (e.g., CM_DCoffset) based on the first power supply voltage and generating the common-mode signal based on the common-mode offset. For certain aspects, generating the common-mode signal may include adjusting a tunable component (e.g., the adjustable current source 410) based on the common-mode offset. For certain aspects, generating the common-mode signal may involve generating the common-mode signal with a second amplifier (e.g., amplifier 420) based on the common-mode offset when the second amplifier has sufficient headroom, and outputting a clamped voltage (e.g., $V_{CMI, max}$) as the common-mode signal when the second amplifier does not have sufficient headroom. For certain aspects, generating the common-mode signal may include generating the common-mode signal with a common-mode generation circuit (e.g., CM generator 400) based on the common-mode offset. In this case, the common-mode generation circuit may include a second amplifier (e.g., amplifier 420) having a first input (e.g., the positive input), a second input (e.g., the negative input), and an output; a voltage divider (e.g., voltage divider 430) having a tap (e.g., tap 432) coupled to the first input of the second amplifier, a feedback circuit (e.g., feedback circuit 440) coupled between the output and the second input of the second amplifier, and a tunable current sink (e.g., the adjustable current source 410) coupled to the first input of the second amplifier. Furthermore, in this case, generating the common-mode signal may involve generating the common-mode signal as a minimum between a predefined maximum value and a difference between: half of a second power supply voltage for the voltage divider and the common-mode offset. For certain aspects, generating the common-mode signal may include determining a zone corresponding to the first power supply voltage and determining the common-mode offset based on the zone corresponding to the first power supply voltage and on battery stack information.

According to certain aspects, applying the common-mode signal to the first amplifier at block 508 may include applying a sum of the common-mode signal and the input signal (e.g., Vin) to a signal input of the first amplifier.

Example Aspects

In addition to the various aspects described above, specific combinations of aspects are within the scope of the disclosure, some of which are detailed below:

Aspect 1: A power amplifier circuit comprising: a first amplifier having a signal input and a power input; and a common-mode adjustment circuit having a first input coupled to the power input of the first amplifier, having an output coupled to the signal input of the first amplifier, and being configured to generate a common-mode signal to apply to the signal input of the first amplifier, based on a power supply voltage on the power input of the first amplifier.

Aspect 2: The power amplifier circuit of Aspect 1, wherein the common-mode adjustment circuit is configured, to generate the common-mode signal, to: determine a common-mode offset based on the power supply voltage on the power input of the first amplifier; and generate the common-mode signal based on the common-mode offset.

Aspect 3: The power amplifier circuit of Aspect 2, wherein the common-mode adjustment circuit comprises a common-mode generation circuit having a tunable component, wherein the common-mode generation circuit is configured to generate the common-mode signal, and wherein the tunable component is configured to be controlled based on the common-mode offset.

Aspect 4: The power amplifier circuit of Aspect 2, wherein the common-mode adjustment circuit comprises a common-mode generation circuit comprising a second amplifier and configured to: generate the common-mode signal based on the common-mode offset when the second amplifier has sufficient headroom; and output a clamped voltage as the common-mode signal when the second amplifier does not have sufficient headroom.

Aspect 5: The power amplifier circuit of Aspect 2, wherein the common-mode adjustment circuit comprises a common-mode generation circuit comprising: a second amplifier having a first input, a second input, and an output; a first resistive element coupled between the output of the second amplifier and the output of the common-mode adjustment circuit; a second resistive element coupled between the output of the common-mode adjustment circuit and the second input of the second amplifier; a third resistive element coupled between the second input of the second amplifier and a reference potential node of the common-mode generation circuit; a fourth resistive element coupled between the first input of the second amplifier and the reference potential node; a fifth resistive element coupled between the first input of the second amplifier and a first power supply rail; and a tunable current sink coupled between the first input of the second amplifier and the reference potential node.

Aspect 6: The power amplifier circuit of Aspect 5, wherein the tunable current sink is configured to sink a variable amount of current based on the common-mode offset.

Aspect 7: The power amplifier circuit of Aspect 5 or 6, wherein a power input of the second amplifier is coupled to a second power supply rail and wherein the second power supply rail is configured to have a lower voltage than the first power supply rail.

Aspect 8: The power amplifier circuit of any of Aspects 5 to 7, wherein the common-mode generation circuit is configured to generate the common-mode signal as a minimum between a predefined maximum value and a difference between half of a voltage of the first power supply rail and the common-mode offset.

Aspect 9: The power amplifier circuit of Aspect 8, wherein the predefined maximum value is equal to a product of a voltage of the second power supply rail and a quotient between: a sum of a resistance of the second resistive element and a resistance of the third resistive element; and a resistance of the first resistive element added to the sum.

Aspect 10: The power amplifier circuit of any of Aspects 5 to 9, wherein a resistance of the fifth resistive element is three times larger than a resistance of the fourth resistive element.

Aspect 11: The power amplifier circuit of any of Aspects 5 to 10, wherein the second resistive element and the third resistive element have equal resistance.

Aspect 12: The power amplifier circuit of Aspect 10 or 11, wherein: the tunable current sink is configured to sink a variable current; the common-mode signal is equal to twice a difference between: a voltage of the first power supply rail divided by four; and a product of the variable current and three-fourths the resistance of the fourth resistive element; and the variable current is set such that the common-mode signal is equal to a difference between half of the voltage of the first power supply rail and the common-mode offset.

Aspect 13: The power amplifier circuit of any of Aspects 2 to 12, wherein the common-mode adjustment circuit further comprises logic configured to: determine a zone corresponding to the power supply voltage; and determine the common-mode offset based on the zone corresponding to the power supply voltage and on battery stack information.

Aspect 14: The power amplifier circuit of any of the preceding Aspects, wherein the common-mode adjustment circuit has a second input coupled to an input node of the power amplifier circuit and wherein the common-mode adjustment circuit is configured to apply, to the signal input of the first amplifier, a sum of the common-mode signal and an input signal on the input node.

Aspect 15: A method of amplification, comprising: amplifying an input signal with a power amplifier circuit comprising a first amplifier powered by a first power supply voltage; sensing the first power supply voltage; generating a common-mode signal based on the first power supply voltage; and applying the common-mode signal to the first amplifier.

Aspect 16: The method of Aspect 15, wherein generating the common-mode signal comprises: determining a common-mode offset based on the first power supply voltage; and generating the common-mode signal based on the common-mode offset.

Aspect 17: The method of Aspect 16, wherein generating the common-mode signal comprises adjusting a tunable component based on the common-mode offset.

Aspect 18: The method of Aspect 16 or 17, wherein generating the common-mode signal comprises: generating the common-mode signal with a second amplifier based on the common-mode offset when the second amplifier has sufficient headroom; and outputting a clamped voltage as the common-mode signal when the second amplifier does not have sufficient headroom.

Aspect 19: The method of Aspect 16, wherein generating the common-mode signal comprises generating the common-mode signal with a common-mode generation circuit based on the common-mode offset, the common-mode generation circuit comprising: a second amplifier having a first input, a second input, and an output; a voltage divider having a tap coupled to the first input of the second amplifier; a feedback circuit coupled between the output and the second input of the second amplifier; and a tunable current sink coupled to the first input of the second amplifier.

Aspect 20: The method of Aspect 19, wherein generating the common-mode signal comprises generating the common-mode signal as a minimum between a predefined maximum value and a difference between half of a second power supply voltage for the voltage divider and the common-mode offset.

Aspect 21: The method of any of Aspects 16 to 20, wherein generating the common-mode signal comprises: determining a zone corresponding to the first power supply voltage; and determining the common-mode offset based on the zone corresponding to the first power supply voltage and on battery stack information.

Aspect 22: The method of any of Aspects 15 to 21, wherein applying the common-mode signal to the first amplifier comprises applying a sum of the common-mode signal and the input signal to a signal input of the first amplifier.

Additional Considerations

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. A power amplifier circuit comprising:
    a first amplifier having a signal input and a power input; and
    a common-mode adjustment circuit having a first input coupled to the power input of the first amplifier, having an output coupled to the signal input of the first amplifier, and being configured to generate a common-mode signal to apply to the signal input of the first amplifier, based on a power supply voltage on the power input of the first amplifier.

2. The power amplifier circuit of claim 1, wherein the common-mode adjustment circuit is configured, to generate the common-mode signal, to:
    determine a common-mode offset based on the power supply voltage on the power input of the first amplifier; and
    generate the common-mode signal based on the common-mode offset.

3. The power amplifier circuit of claim 2, wherein the common-mode adjustment circuit comprises a common-mode generation circuit having a tunable component, wherein the common-mode generation circuit is configured to generate the common-mode signal, and wherein the tunable component is configured to be controlled based on the common-mode offset.

4. The power amplifier circuit of claim 2, wherein the common-mode adjustment circuit comprises a common-mode generation circuit comprising a second amplifier and configured to:
    generate the common-mode signal based on the common-mode offset when the second amplifier has sufficient headroom; and
    output a clamped voltage as the common-mode signal when the second amplifier does not have sufficient headroom.

5. The power amplifier circuit of claim 2, wherein the common-mode adjustment circuit comprises a common-mode generation circuit comprising:
    a second amplifier having a first input, a second input, and an output;
    a first resistive element coupled between the output of the second amplifier and the output of the common-mode adjustment circuit;
    a second resistive element coupled between the output of the common-mode adjustment circuit and the second input of the second amplifier;
    a third resistive element coupled between the second input of the second amplifier and a reference potential node of the common-mode generation circuit;
    a fourth resistive element coupled between the first input of the second amplifier and the reference potential node;
    a fifth resistive element coupled between the first input of the second amplifier and a first power supply rail; and
    a tunable current sink coupled between the first input of the second amplifier and the reference potential node.

6. The power amplifier circuit of claim 5, wherein the tunable current sink is configured to sink a variable amount of current based on the common-mode offset.

7. The power amplifier circuit of claim 5, wherein a power input of the second amplifier is coupled to a second power supply rail and wherein the second power supply rail is configured to have a lower voltage than the first power supply rail.

8. The power amplifier circuit of claim 7, wherein the common-mode generation circuit is configured to generate the common-mode signal as a minimum between a predefined maximum value and a difference between:
    half of a voltage of the first power supply rail; and
    the common-mode offset.

9. The power amplifier circuit of claim 8, wherein the predefined maximum value is equal to a product of a voltage of the second power supply rail and a quotient between:
    a sum of a resistance of the second resistive element and a resistance of the third resistive element; and
    a resistance of the first resistive element added to the sum.

10. The power amplifier circuit of claim 5, wherein a resistance of the fifth resistive element is three times larger than a resistance of the fourth resistive element.

11. The power amplifier circuit of claim 10, wherein the second resistive element and the third resistive element have equal resistance.

12. The power amplifier circuit of claim 11, wherein:
    the tunable current sink is configured to sink a variable current;
    the common-mode signal is equal to twice a difference between:
        a voltage of the first power supply rail divided by four; and
        a product of the variable current and three-fourths the resistance of the fourth resistive element; and
    the variable current is set such that the common-mode signal is equal to a difference between half of the voltage of the first power supply rail and the common-mode offset.

13. The power amplifier circuit of claim 2, wherein the common-mode adjustment circuit further comprises logic configured to:
    determine a zone corresponding to the power supply voltage; and
    determine the common-mode offset based on the zone corresponding to the power supply voltage and on battery stack information.

14. The power amplifier circuit of claim 1, wherein the common-mode adjustment circuit has a second input coupled to an input node of the power amplifier circuit and wherein the common-mode adjustment circuit is configured to apply, to the signal input of the first amplifier, a sum of the common-mode signal and an input signal on the input node.

15. A method of amplification, comprising:
- amplifying an input signal with a power amplifier circuit comprising a first amplifier powered by a first power supply voltage at a power supply input of the first amplifier;
- sensing the first power supply voltage at the power supply input of the first amplifier;
- generating a common-mode signal based on the sensed first power supply voltage; and
- applying the common-mode signal to the first amplifier.

16. The method of claim 15, wherein generating the common-mode signal comprises:
- determining a common-mode offset based on the sensed first power supply voltage; and
- generating the common-mode signal based on the common-mode offset.

17. The method of claim 16, wherein generating the common-mode signal comprises adjusting a tunable component based on the common-mode offset.

18. The method of claim 16, wherein generating the common-mode signal comprises:
- generating the common-mode signal with a second amplifier based on the common-mode offset when the second amplifier has sufficient headroom; and
- outputting a clamped voltage as the common-mode signal when the second amplifier does not have sufficient headroom.

19. The method of claim 16, wherein generating the common-mode signal comprises generating the common-mode signal with a common-mode generation circuit based on the common-mode offset, the common-mode generation circuit comprising:
- a second amplifier having a first input, a second input, and an output;
- a voltage divider having a tap coupled to the first input of the second amplifier;
- a feedback circuit coupled between the output and the second input of the second amplifier; and
- a tunable current sink coupled to the first input of the second amplifier.

20. The method of claim 19, wherein generating the common-mode signal comprises generating the common-mode signal as a minimum between a predefined maximum value and a difference between:
- half of a second power supply voltage for the voltage divider; and
- the common-mode offset.

21. The method of claim 16, wherein generating the common-mode signal comprises:
- determining a zone corresponding to the first power supply voltage; and
- determining the common-mode offset based on the zone corresponding to the first power supply voltage and on battery stack information.

22. The method of claim 15, wherein applying the common-mode signal to the first amplifier comprises applying a sum of the common-mode signal and the input signal to a signal input of the first amplifier.

* * * * *